US010861539B1

(12) United States Patent
Boniardi et al.

(10) Patent No.: US 10,861,539 B1
(45) Date of Patent: Dec. 8, 2020

(54) NEURAL NETWORK MEMORY

(71) Applicant: Micron Technology, Inc., Boise, ID (US)

(72) Inventors: Mattia Boniardi, Cormano (IT); Innocenzo Tortorelli, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/546,520

(22) Filed: Aug. 21, 2019

(51) Int. Cl.
*G11C 11/54* (2006.01)
*G06N 3/08* (2006.01)
*G06N 3/063* (2006.01)
*G11C 13/00* (2006.01)
*H01L 45/00* (2006.01)

(52) U.S. Cl.
CPC ......... *G11C 13/0004* (2013.01); *G06N 3/063* (2013.01); *G06N 3/08* (2013.01); *G11C 11/54* (2013.01); *G11C 13/003* (2013.01); *G11C 13/004* (2013.01); *G11C 13/0061* (2013.01); *G11C 13/0023* (2013.01); *H01L 45/141* (2013.01)

(58) Field of Classification Search
CPC ............ G11C 13/0004; G11C 13/0061; G11C 13/003; G11C 13/004; G11C 13/0023; G11C 11/54; G06N 3/08; H01L 45/141
See application file for complete search history.

(56) References Cited

U.S. PATENT DOCUMENTS

| 2010/0223220 | A1* | 9/2010 | Modha | G06N 3/0635 706/33 |
| 2017/0177994 | A1* | 6/2017 | Salinga | G06N 3/0635 |
| 2019/0164600 | A1 | 5/2019 | Castro | |
| 2019/0198105 | A1 | 6/2019 | Pirovano | |

OTHER PUBLICATIONS

Ambrogio, et al., "Unsupervised Learning by Spike Timing Dependent Plasticity in Phase Change Memory (PCM) Synapses", vol. 10, Article 56, Mar. 8, 2016, 12 pages.

(Continued)

*Primary Examiner* — Sultana Begum
(74) *Attorney, Agent, or Firm* — Brooks, Cameron & Huebsch, PLLC

(57) ABSTRACT

In an example, an apparatus can include an array of memory cells and a neural memory unit controller coupled to the array of memory cells and configured to assert respective voltage pulses during a first training interval to memory cells of the array to change respective threshold voltages of the memory cells from voltages associated with a reset state to effectuate respective synaptic weight changes. The neural memory unit controller can be configured to initiate a sleep interval, during which no pulses are applied to the memory cells, to effectuate respective voltage drifts in the changed respective threshold voltages of the memory cells from a voltage associated with a set state toward the voltage associated with the reset state, and determine an output of the memory cells responsive to the respective voltage drifts in the changed respective threshold voltages after the sleep interval.

21 Claims, 6 Drawing Sheets

(56) References Cited

OTHER PUBLICATIONS

Ambrogio, et al., "Neuromorphic Learning and Recognition With One-Transistor-One-Resistor Synapses and Bistable Metal Oxide RRAM", IEEE Transactions on Electron Devices, vol. 63, No. 4, Apr. 2016, 8 pages.

U.S. Appl. No. 16/001,790, entitled "Weight Storage Using Memory Device", filed Jun. 6, 2018, 58 pages.

Gholipour, Bahar, "Sleep Shrinks the Brain's Synapses to Make Room for New Learning", May 1, 2017, Online Article from Scientific American Mind, 4 pages.

* cited by examiner

677 ──▶

┌─────────────────────────────────────────────────────────────────┐
│ ASSERTING, BY A NEURAL MEMORY UNIT CONTROLLER COUPLED TO A      │
│ PLURALITY OF MEMORY CELLS ARRANGED IN AN ARRAY, A RESPECTIVE    │
│ PLURALITY OF VOLTAGE PULSES DURING A FIRST TRAINING INTERVAL TO THE │ ─ 692
│ PLURALITY OF MEMORY CELLS OF THE ARRAY TO EFFECTUATE A CHANGE IN │
│ RESPECTIVE THRESHOLD VOLTAGES OF THE PLURALITY                  │
│ OF MEMORY CELLS TOWARD A VOLTAGE ASSOCIATED WITH A SET STATE    │
└─────────────────────────────────────────────────────────────────┘
                                │
┌─────────────────────────────────────────────────────────────────┐
│ INITIATING, BY THE NEURAL MEMORY UNIT CONTROLLER, A FIRST       │
│ SLEEP INTERVAL, DURING WHICH NO PULSES ARE APPLIED TO           │
│ THE PLURALITY OF MEMORY CELLS, TO EFFECTUATE A FIRST RESPECTIVE │
│ VOLTAGE DRIFT IN THE CHANGED RESPECTIVE THRESHOLD VOLTAGE OF THE │ ─ 694
│ PLURALITY OF MEMORY CELLS, WHEREIN A VOLTAGE DRIFT IS           │
│ A CHANGE IN THE RESPECTIVE THRESHOLD VOLTAGE OF THE RESPECTIVE  │
│ MEMORY CELLS TOWARD A VOLTAGE ASSOCIATED WITH A RESET STATE     │
└─────────────────────────────────────────────────────────────────┘

*Fig. 6*

NEURAL NETWORK MEMORY

TECHNICAL FIELD

The present disclosure relates generally to operating apparatus, such as memories, and, more particularly, to neural network memory.

BACKGROUND

Memory devices may typically be provided as internal, semiconductor, integrated circuits in computers or other electronic devices. Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory cells may lose their stored state over time unless they are periodically refreshed by an external power source.

Various memory arrays can be organized in a cross-point architecture with memory cells (e.g., two terminal cells) being located at intersections of a first and second signal lines used to access the cells (e.g., at intersections of access lines and sense lines). Some memory cells can be, for example, memory cells arranged in a three-dimensional cross-point architecture (e.g., 3DXPoint™) cells or Self-Selecting Memory (SSM) cells whose state (e.g., stored data value) depends on the resistance and/or threshold voltage of the memory cell. Some memory cells comprise different chalcogenide materials which can serve as a select element and a storage element for the memory cell (e.g. 3DXPoint). In some other examples, some memory cells comprise a single chalcogenide material which can serve as both a select element and a storage element (e.g. SSM).

Improving memory devices, generally, may include increasing memory cell density, increasing read/write speeds, increasing reliability, increasing data retention, reducing power consumption, or reducing manufacturing costs, among other metrics.

BRIEF DESCRIPTION OF THE DRAWINGS

FIG. 6 illustrates an example method for neural network memory using a memory device in accordance with embodiments of the present disclosure.

DETAILED DESCRIPTION

Figure 1:
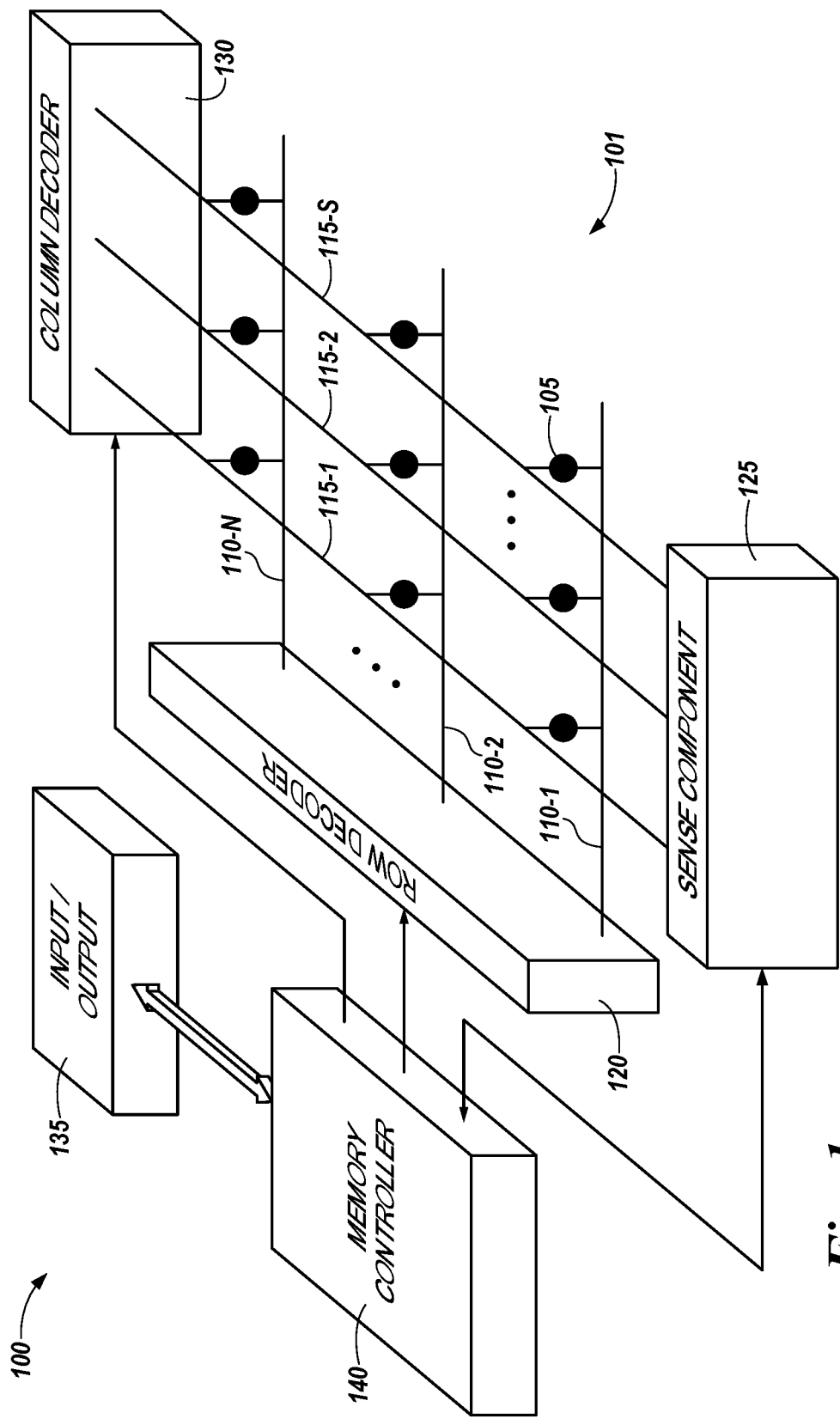
FIG. 1 illustrates an example of an apparatus in the form of a memory array of a memory device in accordance with various embodiments of the present disclosure.

Systems, apparatuses, devices, and methods configured to mimic neuro-biological architectures that can be present in a nervous system and/or to store synaptic weight to represent learning are described herein. An example apparatus can include, an array of memory cells and a neural memory unit controller coupled to the array of memory cells. The neural memory unit controller can be configured to assert a respective voltage pulse during a first training interval to memory cells of the array to change respective threshold voltages of the memory cells from voltages associated with a reset state to effectuate respective synaptic weight changes. The neural memory unit controller can be further configured to initiate a sleep interval, during which no pulses are applied to the memory cells, to effectuate respective voltage drifts in the changed respective threshold voltages of the memory cells from a voltage associated with a set state toward the voltage associated with the reset state, and determine an output of the memory cells responsive to the respective voltage drifts in the changed respective threshold voltages after the sleep interval.

In neural networks a synaptic weight can refer to the strength and/or amplitude of a connection between two nodes (e.g., a neuron in a biological neural network). The nature and content of information transmitted through a biological neural network can be based in part on the properties of synapses formed between the nodes (e.g., synaptic weight). Memory arrays can be operated as artificial neural network memory (e.g., neuromorphic systems and devices) and can be designed to achieve results that may not be possible with traditional computer architectures. For example, neuromorphic systems can be used to achieve results more commonly associated with biological systems such as learning, vision or visual processing, auditory processing, advanced computing, sleep, other processes, or a combination thereof. Artificial neural networks may be referred to herein as neural networks.

As will be described further herein, memory cells can be arranged into an array (e.g., a neural memory unit) to mimic neuro-biological functionality such as learning. The memory cells can include a chalcogenide material that can change physical state responsive to a magnitude of voltage pulse and/or a polarity of voltage pulse applied thereto (e.g., during a training interval). A set physical state is a conductive state (e.g., low-resistance to current flow) and a reset physical state is a less conductive state (e.g., higher resistance to current flow). The change in physical state of the chalcogenide material between a set state and a reset state is due to different material configurations based at least in part on a voltage magnitude across the configurable material (e.g., in the case of a 3DXPoint memory cell) and/or on a direction of current applied through a configurable material and/or a combination of a polarity of a voltage across the configurable material and a direction of current applied through a configurable material (e.g., in the case of an SSM cell). The change in physical state of the chalcogenide material between a set state and a reset state can change the threshold voltage value of the memory cell in an analog fashion. The analog threshold voltage change of the chalcogenide material of the memory cell can represent a synaptic weight in a neuromorphic memory system. Changes in synaptic weight can represent and/or be interpreted to represent learning and other biological functions. During a training interval, a quantity of voltage pulses can be applied to a memory cell (e.g. short set pulses or read pulses). The voltage pulses can have a magnitude, for example, above or below ("sub-threshold") a threshold voltage of the memory cell. A length of time a pulse is applied to be applied to the memory cell of a neural memory unit can be adjusted during the training interval.

In biology, a learning event can be the result of causal propagation of spikes among neurons, enabling a synaptic weight increase for the connecting synapses. In artificial neural networks, a learning event can be the result of a training interval. In biology, a synaptic weight increase of a synapse can be represented by an electrical conduction enhancement. A solid-state memory array (e.g., a 3DXPoint or an SSM cell array) can mimic an array of synapses, each characterized by a weight, or a memory cell conductance. The greater the conductance (e.g., exhibited by a memory cell having a relatively low threshold voltage), the greater the synaptic weight and the higher the degree of memory learning. The lesser the conductance (e.g., exhibited by a memory cell having a relatively high threshold voltage), the lesser the synapse weight and the lesser the degree of memory learning. As an example, a synaptic weight and/or a connection between at least two memory cells can mimic learning when the memory cell is enhanced by a voltage pulse.

As used herein, the term "enhanced" refers to a memory cell that has a relatively low threshold voltage (Vth) corresponding to a high conductance (e.g., low resistance to current flow) when compared to memory cells with low conductance (e.g., high threshold voltage, and/or high resistance to current flow). An enhanced memory cell represents a relatively greater degree of learning during a training interval. In other words, the voltage applied to the memory cell during a training interval effectuated a change in the respective threshold voltage of the respective memory cell toward a set state. An enhanced memory cell can be regarded as storing a greater synaptic weight than a non-enhanced memory cell. A training interval can include one or more voltage pulses asserted to the memory cells of the array.

As used herein, the term "non-enhanced" refers to a memory cell that has a relatively high threshold voltage corresponding to a low conductance (e.g., high resistance to current flow) compared to memory cells with high conductance (e.g., low threshold voltage, and/or low resistance to current flow). A non-enhanced memory cell represents a relatively lesser degree of learning (or, simply, not learning) during the training interval. In other words, the voltage applied to the memory cell during a training interval did not effectuate a significant change in the threshold voltage of the memory cell toward a set state. A non-enhanced memory cell can be regarded as storing a lesser synaptic weight than an enhanced memory cell. However, embodiments are not limited to this convention. In some embodiments, non-enhanced memory cells can be regarded as storing a greater synaptic weight and enhanced memory cells can be regarded as storing a lesser synaptic weight.

Systems, devices, and methods describing neural network memory arrays configured to mimic neuro-biological architectures that can be present in a nervous system and/or to store synaptic weights associated with enhanced and non-enhanced memory cells are described herein. Memory cells can store data by changing the material configuration of a chalcogenide material in between a set state and a reset state, which can also change the respective threshold voltage value of the respective memory cell in an analog fashion. The respective threshold voltage of a programmed memory cell can therefore be anywhere between a threshold voltage associated with a set state and a reset state. The analog variability of the threshold voltage, while allowing for the storage of variable synaptic weights in the memory cell, can also create difficulty in making a binary determination as to whether the memory cells have been enhanced following a training interval. The difficulty arises because the array of cells will have threshold voltages across the spectrum between those associated with the set and reset states, and a clear distinction between threshold voltages that should be considered enhanced versus non-enhanced is not obvious.

However, according to at least one embodiment of the present disclosure, a sleep interval can be initiated to allow memory cells to experience a voltage drift after the material configuration of the chalcogenide material has changed during the training interval. As used herein the term "sleep interval" refers to a period of time when the memory cells of an array are not allowed to be accessed so that voltage drift can occur. The memory device can be in an idle state (e.g., low power and/or switched off) during the sleep interval. Voltage drift refers to a change in threshold voltage (e.g., change in resistance) of a memory cell (e.g., a 3DXPoint cell or an SSM cell) toward a reset state over a period of time. In other words, voltage drift refers to the tendency of the memory cell to have an increased threshold voltage over time. Voltage drift can occur when the memory cells of an array are not being accessed.

The voltage drift of a memory cell can be gradual or rapid, and the degree to which voltage drift occurs can be dependent on the threshold voltage value of the memory cell before the sleep interval. For example, memory cells having a higher threshold voltage can drift toward a reset state faster and/or to a greater degree compared to a memory cell having a lower threshold voltage during a sleep interval of a given duration. Because memory cells with a higher threshold voltage drift toward a reset state faster than memory cells with a lower threshold voltage, the effect of the sleep interval on the distribution of threshold voltages in between set and reset for a memory cell array is a widening thereof. The result of this widening of the distribution of threshold voltages between set and reset allows a better determination of whether any particular memory cell is enhanced or non-enhanced. In other words, a signal to noise ratio (SNR) between memory cells considered to be enhanced versus non-enhanced is improved producing a more digital output than a memory cell array that has not been allowed to drift.

The voltage drift of a memory cell of an array of memory cells can emulate the biological function of sleep. In biology, synaptic resetting happens during sleep and represents an important function for learning. After a learning cycle, sleep is able to rule out the non-enhanced synapses, providing better information setting and new physical space to be dedicated to new learning and new memory. Likewise, the sleep interval disclosed herein can emulate sleep, leading to the resetting of non-enhanced memory cells.

A neural memory unit controller can be coupled to an array of memory cells arranged in a neural network. The neural network unit controller can be configured to cause pulses to be applied to memory cells of the array during a training interval to emulate learning via the synaptic weights represented by the threshold voltages of the memory cells. The neural memory unit controller can increase the SNR of the memory cells considered to be enhanced versus non-enhanced to distinguish between cells that have learned and cells that did not learn after a sleep interval. The sleep interval can emulate the biological function of sleep in neural network memory. Using these methods, the neural memory unit controller can switch back and forth between training interval and a sleep interval (e.g., a voltage drift) to distinguish between memory cells of an array which have learned (e.g., increased a synaptic weight).

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N", "P", and "S", as used herein, particularly with respect to reference numerals in the drawings, indicates that a number of the particular feature so designated can be included with a number of embodiments of the present disclosure. The number may be the same or different between designations.

The figures herein follow a numbering convention in which the first digit or digits correspond to the drawing figure number and the remaining digits identify an element or component in the drawing. Similar elements or components between different figures may be identified by the use of similar digits. For example, 101 may reference element "01" in FIG. 1, and a similar element may be referenced as 201 in FIG. 2.

FIG. 1 illustrates an example of an apparatus in the form of a memory array 101 of a memory device 100 in accordance with various embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. FIG. 1 is an illustrative representation of various components and features of the memory device 100. As such, it should be appreciated that the components and features of the memory device 100 are shown to illustrate functional interrelationships, not their actual physical positions within the memory device 100.

Although some elements included in FIG. 1 are labeled with a numeric indicator, other corresponding elements are not labeled, though they are the same or would be understood to be similar, in an effort to increase the visibility and clarity of the depicted features. For example, only one memory cell is labeled with reference numeral 105 although several are depicted.

In the illustrative example of FIG. 1, the memory device 100 includes a memory array 101. The memory array 101 includes memory cells 105 that are programmable to store different states. In some embodiments, each memory cell 105 can be programmable to store two states, denoted as a logic 0 and a logic 1. In some embodiments, a memory cell 105 can be configured to store more than two logic states. A memory cell 105 may, in some embodiments, include a 3DXPoint cell or an SSM cell such as a memory cell having different chalcogenide materials to operate as a selection component and a storage component (e.g. 3DXPoint), or a single chalcogenide material to operate as both a selection component and a storage component (e.g. SSM).

As will be described further herein, memory cells 105 can be arranged into an array (e.g., a neural memory unit) to mimic neurobiological functionality such as learning and sleep. The memory cells can include a chalcogenide material that can change physical state (e.g., chalcogenide material configurations) responsive to various characteristics of a voltage applied thereto, such as magnitude, quantity of applications, and/or duration, and/or of a polarity applied thereto, such as positive or negative. A set physical state is a chalcogenide material configuration that is more conductive (e.g., low-resistance to current flow) and a reset physical state is another configuration of the chalcogenide material that is less conductive (e.g., higher resistance to current flow). Changing the physical state or configuration of the chalcogenide material in between a set state and a reset state (e.g., in a fashion that may be referred to as "non-binary" or "analog") can change the threshold voltage value of the memory cell in a corresponding non-binary or analog fashion. The analog threshold voltage change of the memory cell can represent a synaptic weight in a neuromorphic memory system. Changes in synaptic weight can represent and/or be interpreted to represent learning and other biological functions.

In some embodiments, each row of memory cells 105 is connected to a first signal line 110-1, 110-2, or 110-N (e.g., an access line, sometimes referred to as a word line), and each column of memory cells 105 is connected to a second signal line 115-1, 115-2, or 115-S (e.g., a sense line, sometimes referred to as a bit line). Both access lines 110 and sense lines 115 can also be generically referred to as signal lines. Access lines 110 and sense lines 115 can be substantially perpendicular to one another and can support an array of memory cells. As used herein, the term "substantially" means that the modified characteristic (e.g., a verb or adjective modified by the term substantially) need not be absolute but is close enough so as to achieve the advantages of the characteristic. Although not illustrated in FIG. 1 so as not to obscure examples of the disclosure, memory array 101 can include a substrate (further described herein in connection with FIG. 2).

In general, one memory cell 105 can be located at the intersection of two signal lines such as an access line 110 and a sense line 115. For example, memory cell 105 is located at the intersection of access line 110-1 and sense line 115-S. This intersection can be referred to as the address of the memory cell 105.

Chalcogenide materials can be materials or alloys that include at least one of the elements sulfur (S), selenium (Se), and tellurium (Te). Chalcogenide materials can be glasses or non-glasses. In some examples 3DXPoint memory cells and SSM cells may include a chalcogenide glass and/or non-glass material. The memory cell 105 may, for example, include a chalcogenide glass such as, for example, an alloy of selenium (Se), tellurium (Te), arsenic (As), antimony (Sb), carbon (C), germanium (Ge), and silicon (Si). In some example, a chalcogenide material having primarily selenium (Se), arsenic (As), and germanium (Ge) may be referred to as SAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms. Chalcogenide non-glass materials can include alloys of S, Se, Te, germanium (Ge), arsenic (As), aluminum (Al), antimony (Sb), gold (Au), indium (In), gallium (Ga), tin (Sn), bismuth (Bi), palladium (Pd), cobalt (Co), oxygen (O), silver (Ag), nickel (Ni), platinum (Pt). Example chalcogenide non-glass materials and alloys can include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te can include $Ge_xTe_y$, where x and y can be any positive integer. Other examples of chalcogenide materials can include binary metal oxide materials or mixed valence oxide including two or more metals, e.g., transition metals, alkaline earth metals, and/or rare earth metals. Embodiments are not limited to a particular chalcogenide material or materials associated with the memory elements of the memory cells. Other examples of materials can be used to form memory elements and can include colossal magnetoresistance materials, or polymer-based materials, among others.

Operations such as reading and programming can be performed on memory cells 105 by activating or selecting access line 110 and sense line 115. Activating or selecting an access line 110 or a sense line 115 can include applying a voltage to the respective line. Access lines 110 and sense lines 115 can be made of conductive materials such as metals (e.g., copper (Cu), Al, Au, tungsten (W), titanium (Ti), metal alloys, carbon, conductively-doped semiconductors, or other conductive materials, alloys, compounds, or the like.

In some architectures, the logic storing device of a cell (e.g., a resistive component in a CBRAM cell, a capacitive component in a FeRAM cell) can be electrically isolated from the sense line by a selection component. The term "isolated" refers to a relationship between components in which electrons are not presently capable of flowing between them; components are isolated from each other if there is an open circuit between them. In other architectures, such as those including an SSM cell the chalcogenide material can act as both the selection component and the storage element. The access line 110 can be connected to and can control the selection component. For example, the selection component can be a transistor and the access line 110 can be connected to the gate of the transistor.

The selection component can be an element of a memory cell 105, which can comprise a chalcogenide material (e.g. chalcogenide glass). The selection component can be part of a 3D XPoint™ array, and in the case of SSM cells the chalcogenide material can act as both the selection component and the storage element. Activating the access line 110 can result in an electrical connection or closed circuit between the logic storing device of the memory cell 105 and its corresponding sense line 115. The sense line can then be accessed to either read or program the memory cell 105. Upon selecting a memory cell 105, the resulting signal can be used to determine the stored logic state. In some cases, a first logic state can correspond to no current or a negligibly small current through the memory cell 105, whereas a second logic state can correspond to a finite current. In some cases, a memory cell 105 can include a memory cell that includes a storage component and a selection component, the storage component and the selection component both made by a chalcogenide material, a CBRAM cell, or a FeRAM cell.

Accessing memory cells 105 can be controlled through a row decoder 120 and a column decoder 130. For example, a row decoder 120 can receive a row address from the memory controller 140 (e.g., a neural memory unit controller) and activate the appropriate access line 110 based on the received row address. Similarly, a column decoder 130 can receive a column address from the memory controller 140 and activate the appropriate sense line 115. For example, memory array 101 can include multiple access lines 110-1, 110-2, and 110-N and multiple sense lines 115-1, 115-2, and 115-S, where S and N depend on the array size. Thus, by activating an access line 110 and a sense line 115, e.g., 110-1 and sense line 115-S, the memory cell 105 at the intersection can be accessed.

Upon accessing, a memory cell 105 can be read, or sensed, by sense component 125 to determine the stored state of the memory cell 105. For example, a voltage can be applied to a memory cell 105 (using the corresponding access line 110 and sense line 115) and the presence of a resulting current through the memory cell 105 can depend on the applied voltage and the threshold voltage of the memory cell 105. In some cases, more than one voltage can be applied. Additionally, if an applied voltage does not result in current flow, other voltages can be applied until a current is detected by sense component 125. By assessing the voltage that resulted in current flow, the threshold voltage of the memory cell 105 can be determined. In some cases, the voltage can be ramped up in magnitude until a current flow is detected. In other cases, predetermined voltages can be applied sequentially until a current is detected. Likewise, a voltage can be applied to a memory cell 105 and the magnitude of the voltage to create the current can depend on the electrical resistance of the chalcogenide material of the memory cell 105 and/or the threshold voltage of the memory cell 105.

In some examples, described herein, in which the memory cell is an SSM cell, applying read pulses (pulses that would otherwise normally be used to read the memory cell) can change the respective threshold voltage of the memory cell 105 in an analog fashion, according to a read disturb phenomenon. In other words, an initial threshold voltage of an SSM cell may change incrementally (e.g., in an analog fashion), responsive to having been pulsed. This change in threshold voltage can be responsive to the chalcogenide material of the memory cell being altered to a different state.

The memory controller 140 can generate row and column address signals in order to activate the desired access line 110 and sense line 115. Memory controller 140 can also generate and control various voltages or currents used during the operation of memory device 100. In general, the amplitude, shape, polarity, and/or duration of an applied voltage or current discussed herein can be adjusted or varied and can be different for the various operations discussed in operating the memory device 100.

The memory controller 140 can execute a learning algorithm and control various voltages or currents used during the learning algorithm. A learning algorithm can include variables executed during a training interval. A training interval can include variables such as a quantity, duration, polarity and/or magnitude of voltage pulses. A neural memory unit controller (e.g., the memory controller 140) can apply the learning algorithm to the array 101 to attempt to elicit a learning event from the memory cells of the neural memory unit.

A learning algorithm variable can further include one or more sleep intervals to effectuate a voltage drift. The sleep interval can pertain to a period of time following a training interval where the memory cells 105 are not being accessed. The sleep interval can be an emulation (e.g., or reproduction) of the biological function of sleep within a neural network.

The neural network unit controller (e.g., the memory controller 140) can be configured to execute a learning algorithm and assert a voltage pulse to respective memory cells (e.g., the memory cells 105) of the array 101 during a training interval to change respective threshold voltages of the memory cells from a voltage associated with a reset state toward a voltage associated with a set state. The neural network unit controller can further initiate a sleep interval to effectuate a voltage drift in the changed threshold voltage of the memory cell from a voltage associated with the set state toward the voltage associated with the reset state, where the voltage drift is a change in the threshold voltage toward the voltage associated with the reset state.

The chalcogenide material of the memory cell 105 can change in condition based on a voltage pulse received from the memory controller 140 during a training interval. The neural memory unit controller can be configured to assert the respective voltage pulses in a training interval and initiate a sleep interval to effectuate the respective voltage drift of the respective threshold voltages of the memory cells. The neural memory unit controller can be configured to assert the respective voltage pulses to the memory cells to change the respective chalcogenide material (e.g., a phase change storage component) from an amorphous condition associated with the reset state to a transition state between a reset state and set state (e.g., toward a crystalline condition associated with the set state) after the sleep interval.

The voltage drift of the changed threshold voltage of the memory cell during the sleep interval can be greater when the changed threshold voltage of the memory cell is closer to the voltage associated with the reset state than the voltage associated with the set state. In contrast, the voltage drift in the changed threshold voltage of the memory cell during the sleep interval can be lesser when the changed threshold voltage of the memory cell is closer to the voltage associated with the set state than the voltage associated with the reset state.

For example, the memory controller 101 can be configured to initiate the sleep interval to effectuate a first synaptic weight change in a first memory cell and a second synaptic weight change in a second memory cell. The first synaptic weight change and the second synaptic weight change can be different or the same and can correspond to threshold voltages of the first and second memory cell that are closer to a voltage associated with a reset state than a set state. In this example, the voltage drift is greater because the threshold voltages of the first and the second memory cells are closer to a reset state than a set state.

In other examples, the memory controller 101 can be configured to initiate a sleep interval to effectuate a first synaptic weight change in a first memory cell and a second synaptic weight change in a second memory cell. The first synaptic weight change and the second synaptic weight change can be different or the same and correspond to changed respective threshold voltages of the first and second memory cell that are closer to a voltage associated with a set state than a reset state. In this example, the voltage drift is lesser, responsive to the changed respective threshold voltages of the first and the second memory cells being closer to a set state than a reset state. Using these methods, a distinction can be made between memory cells that have learned and memory cells that have not learned by increasing the SNR of the memory cells of the array 101 considered to be enhanced versus non-enhanced.

In some embodiments, subsequent training intervals can be applied to the memory array 101. Each training interval can vary in a number of pulses, a magnitude of pulses, a polarity of pulses, and/or a duration of pulses. In a non-limiting example, additional voltage pulses during subsequent training intervals can each decrease a resistance of the memory cell (e.g., a 3DXPoint cell or SSM cell) to represent an increased synaptic weight (e.g., learning). In other embodiments, the additional voltage pulses during the subsequent training intervals can have a null effect and/or increase the resistance of a memory cell to represent a decreased synaptic weight (e.g., no learning). For example, the memory controller 140 can be configured to assert one of the additional respective voltage pulses during one of the subsequent training intervals to memory cells of the array 101 in response to the output of the memory cells indicating that increased learning has occurred responsive to the effectuated voltage drift.

Each subsequent training interval can be followed by a sleep interval, and the neural memory unit controller (e.g., the memory controller 140) can assert an additional respective voltage pulse during one of the subsequent training intervals to the memory cell 105 in response to an output of the memory cell 105 indicating that increased learning has occurred responsive to an effectuated voltage drift. Specifically, the increased learning can occur responsive to the sleep interval and voltage drift when the output value indicated a distinct SNR in between the memory cells 105 considered to be enhanced versus non-enhanced, and/or when the synaptic weights are high. In contrast a decreased synaptic weight indicates a higher resistance and that learning has not occurred. In some examples, synaptic weights can be increased or left unchanged, and the resistance of the memory cells 105 can remain unchanged responsive to subsequent training intervals.

Figure 2:
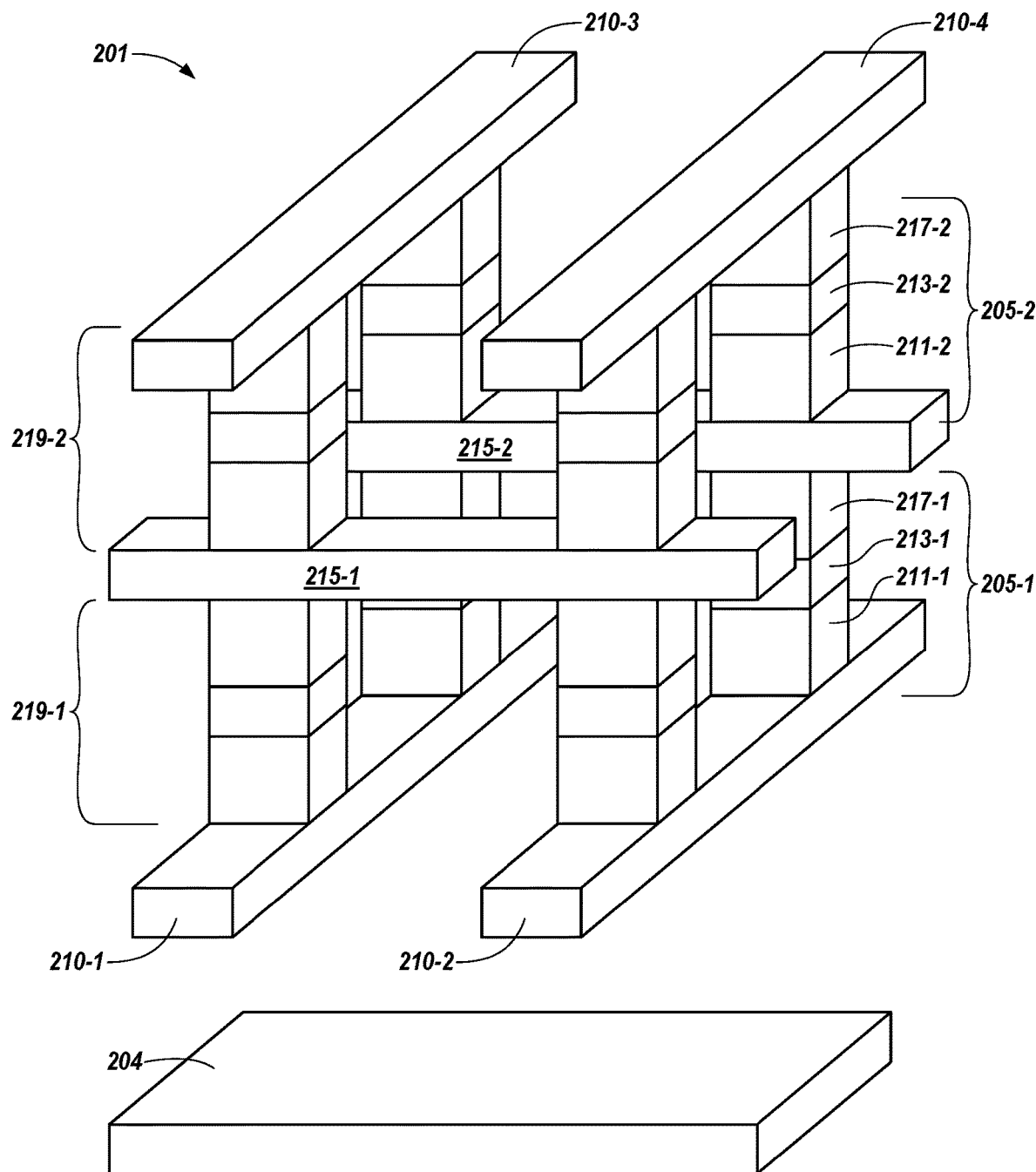
FIG. 2 illustrates an example of a three-dimensional memory array that supports neural network memory in accordance with embodiments of the present disclosure.

FIG. 2 illustrates an example of a three-dimensional memory array that supports neural network memory in accordance with embodiments of the present disclosure. Memory array 201 can be an example of portions of memory array 101 described with reference to FIG. 1. Memory array 201 can include a first array or deck 219-1 of memory cells that is positioned above a substrate 204 and a second array or deck 219-2 of memory cells on top of the first array or deck 219-1. Memory array 201 can also include access line 210-1, access line 210-2, and sense line 215-1, which can be examples of access lines 110 and sense lines 115, as described with reference to FIG. 1.

As in the illustrative example depicted in FIG. 2, memory cells of the first deck 219-1 and the second deck 219-2 can each include a memory cell 205-1 and 205-2, respectively. The memory cell 205-1 and 205-2 can be examples of memory cells 105 described in connection with FIG. 1. In some examples, memory cells 205-1, 205-2 of the first deck 219-1 and the second deck 219-2 can each include a type of memory cell other than 3DXPoint or SSM cell, that can be suitable for a cross-point architecture (e.g., a PCM cell, an SSM cell, a CBRAM cell, and/or an FeRAM cell). Although some elements included in FIG. 2 are labeled with a numeric indicator, other corresponding elements are not labeled, though they are the same or would be understood to be similar, in an effort to increase the visibility and clarity of the depicted features.

In some cases, the memory cells 205-1 of the first deck 219-1 can each include first electrode 211-1, chalcogenide material 213-1, and second electrode 217-1. In addition, memory cells of the second deck 219-2 can each include first electrode 211-2, chalcogenide material 213-2, and second electrode 217-2. In some embodiments, access lines (e.g., access line 210 in FIG. 1) can include an electrode layer (e.g., a conformal layer), in lieu of electrodes 211 or 217 and thus can comprise multi-layered access lines. In such embodiments, the electrode layer of the access lines can interface with a memory material (e.g., chalcogenide material 213). In some embodiments, access lines (e.g., access line 210, sense line 215) can directly interface with a memory material (e.g., chalcogenide material 213) without an electrode layer or an electrode in-between.

The memory cells of the first deck 219-1 and second deck 219-2 may, in some embodiments, have common conductive lines such that corresponding (e.g., vertically aligned in y-direction) memory cells of each deck 219-1 and 219-2 can share sense lines 115 or access lines 110 as described with reference to FIG. 1. For example, first electrode 211-2 of the second deck 219-2 and second electrode 217-1 of the first deck 219-1 can both be coupled to sense line 215-2 such that sense line 215-2 is shared by vertically aligned and adjacent memory cells (in y-direction).

The architecture of memory array 201 can in some cases be referred to as an example of a cross-point architecture, as a memory cell can be formed at a topological cross-point between an access line 210 and a sense line 215 as illustrated in FIG. 2. Such a cross-point architecture can offer relatively high-density data storage with lower production costs compared to some other memory architectures. For example, a memory array with a cross-point architecture can have memory cells with a reduced area and, resultantly, can support an increased memory cell density compared to some other architectures.

The memory array 201 can include two or more two-dimensional (2D) memory arrays formed on top of one another. This can increase a number of memory cells that can be placed or created on a single die or substrate as compared with a single 2D array, which in turn can reduce production costs, or increase the performance of the memory device, or both. In the example depicted in FIG. 2, memory array 201 includes two levels of memory cells 205 (e.g., memory cell 205-1 and memory cell 205-1) and can be considered a 3D memory array. However, the number of levels may not be limited to two, and other examples can include additional levels. Each level can be aligned or positioned such that memory cells 205 can be aligned (exactly, overlapping, or approximately) across levels with each other.

As shown in FIG. 2, the two memory cells 205-1, 205-2 that are stacked can share a common conductive line such as a sense line 215-2. A sense line 215-2 can be coupled with the upper memory cell 205-2 and the lower memory cell 205-1. Other configurations may be possible, for example, a third layer (not shown) can share an access line with the upper memory cell 205-2. The access line 210 can be connected to and can control the selection component. For example, the selection component can be a transistor and the access line 210 can be connected to the gate of the transistor. Alternatively, the selection component can be a resistance component, which can comprise a chalcogenide material. Activating the access line 210 can result in an electrical connection or closed circuit between the logic storing device of the memory cell 205 and its corresponding sense line 215. In some embodiments, for example when the memory cell 205 is an SSM cell, the logic-storing device also acts as a selection component. The sense line can then be accessed to either read or program the memory cell 205. Upon selecting a memory cell 205, the resulting signal can be used to determine the stored logic state. In some cases, a first logic state can correspond to no current or a negligibly small current through the memory cell 205, whereas a second logic state can correspond to a finite current or a threshold current.

The memory cells 205 of each deck 219-1 and deck 219-2 can experience training intervals and sleep intervals, enabling a synaptic weight increase for the connecting synapses, as described in connection with examples of FIG. 1. A solid-state memory array having multiple decks 219 can mimic an array of synapses, each characterized by a weight, or a memory cell conductance. The greater the conductance the greater the synaptic weight and the higher the degree of memory learning. The lesser the conductance the lesser the synapse weight and the lesser the degree of memory learning. Sleep intervals can follow training intervals in memory arrays including multiple decks 219. Sleep intervals following training intervals can provide disambiguation between the enhanced (e.g., exhibiting a higher degree of learning) and non-enhanced memory cells (e.g., exhibiting a lesser degree of learning.

Figure 3:
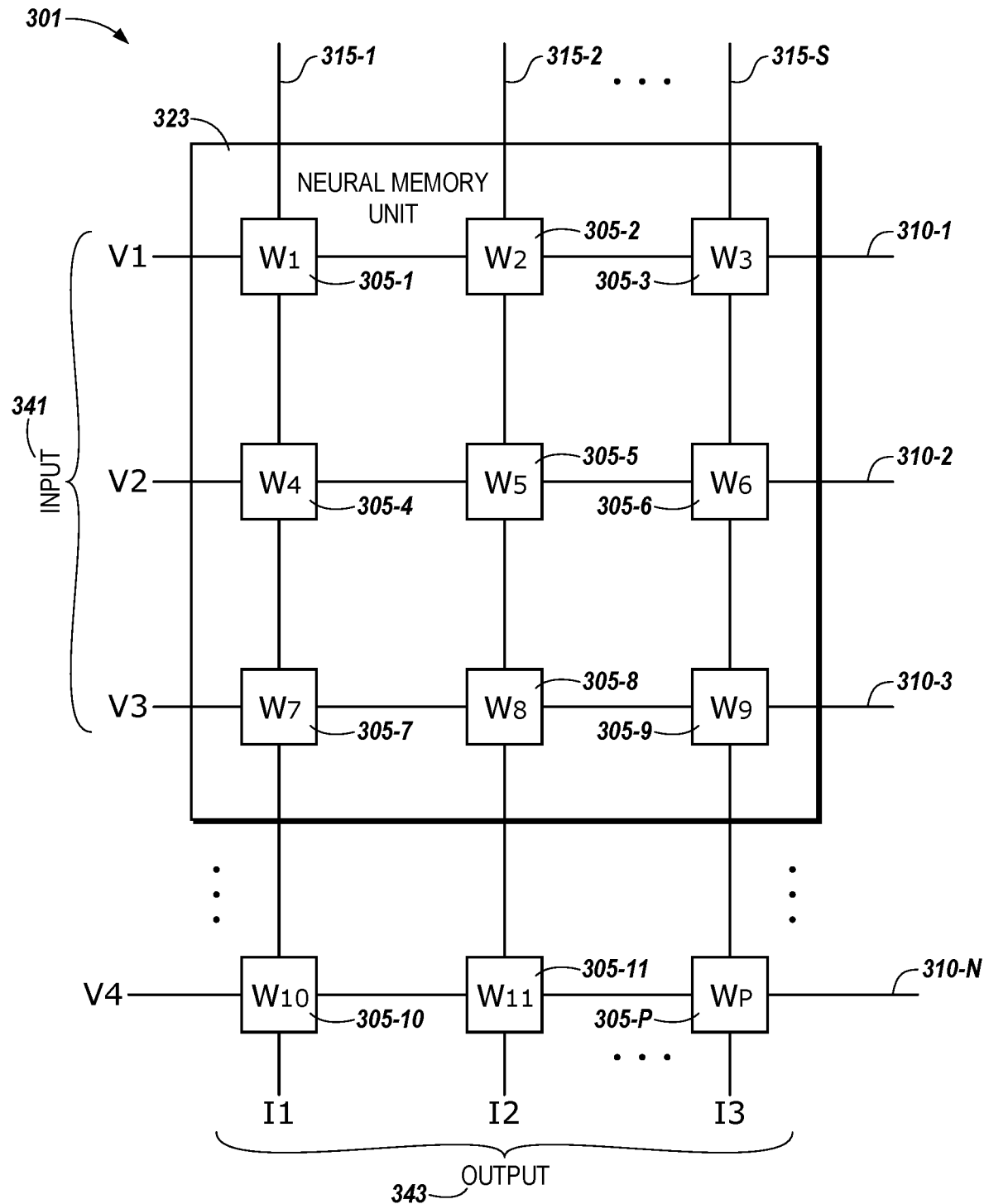
FIG. 3 illustrates an example of a memory array that shows features of an operation on memory cells that support neural network memory in accordance with embodiments of the present disclosure.

FIG. 3 illustrates an example of a memory array 301 that shows features of an operation on memory cells that support neural network memory in accordance with embodiments of the present disclosure. The memory array 301 can be similar to the example memory arrays 101, and 201 of FIGS. 1 and 2 and/or be a cross-point array similar to the memory array 303 of FIG. 3. The memory array 301 can include a neural memory unit 323 which can include a portion or all of the memory cells 305 in the array 301. The memory array 301 can include multiple memory cells 305-1, 305-2, 305-3, 305-4, 305-5, 305-6, 305-7, 305-8, 305-9, 305-10, 305-11, and 305-P (can be collectively referred to as the memory cells 305). Each memory cell 305 can correspond to a synaptic weight W1, W2, W3, W4, W5, W6, W7, W8, W9, W10, W11, and WP. Each synaptic weight can change based on the threshold voltage of the memory cell 305.

The memory array 301 can include a neural memory unit 323 which can include a portion or all of the memory cells 305 in the array 301. The memory cells 305 of the neural memory unit 323 can be coupled to sense lines 315-1, 315-2, 315-S (can be collectively referred to as sense lines 315) and access lines 310-1, 310-2, 310-3, 310-N (can be collectively referred to as access lines 310).

In some examples, a portion of the memory cells 305 of the memory array 301 may not be included in the neural memory unit 323. In the example array 301, the neural memory unit 323 includes memory cells 305-1, 305-2, 305-3, 305-4, 305-5, 305-6, 305-7, 305-8, and 305-9 and the memory cells 305-10, 305-11, and 305-P can be excluded from the neural memory unit 323. Thus, memory cells 305 coupled to access line 310-N can be included in the memory array 301 but not necessarily be a part of the neural memory unit 323. In such examples, the memory cells 305-10, 305-11, and 305-P can be excluded from the total output value stored by the neural memory unit 323.

A neural memory unit controller (e.g., memory controller 140 of FIG. 1) can select a neural memory unit 323 for a read operation. In some cases, the neural memory unit controller can select one or more memory cells 305 of the neural memory unit 323 for a read operation. The neural memory unit controller can identify and/or select one or more sense lines 315 and/or access lines 310 associated with the neural memory unit 323.

During a training interval, the neural memory unit controller can provide an input 341 to the memory cells 305 of the neural memory unit 323. The input 341 can include voltage values applied to access lines 310 (e.g., V1, V2, V3). The neural memory unit controller can bias the access lines 310 to one or more voltage values (e.g., a read voltage value) included in the input 341. In some cases, the access lines 310 are all biased to the same read voltage. In some cases, the neural memory unit controller can bias one or more access lines to a different voltage than the other access lines.

The input 341 can alter the threshold voltage of the memory cells 305-1, 305-2, 305-3, 305-4, 305-5, 305-6, 305-7, 305-8, and 305-9 included in the neural memory unit 323. The neural memory unit controller can assert the voltage pulses V1, V2, and V3 of input 341 to change the respective threshold voltages (e.g., change in respective resistance) of the respective memory cells 305 included in the neural memory unit 323 toward a set state. The memory cells 305 can have different threshold respective threshold voltages that affect a degree to which the threshold voltages can move toward the set state.

Memory cells 305 that include a lower threshold voltage can be altered toward threshold voltage associated with a set state and include a higher synaptic weight. For example, memory cell 305-1 can have a lower threshold voltage and correspond to a synaptic weight W1. When the memory cell 305-1 is pulsed during a training interval, the threshold voltage of the memory cell 305-1 can change toward a voltage associated with a set state and the synaptic weight W1 will be relatively high compared to a different memory cell 305 with a higher threshold voltage. Following the training interval, the neural memory unit controller can initiate a sleep interval for each of the respective memory cells 305 coupled to the first signal lines 310 to effectuate respective voltage drifts in the changed respective threshold voltages of the respective memory cells 305, wherein the voltage drift alters the changed respective threshold voltage toward a voltage associated with a reset state. The voltage drift for the memory cell 305-1 is smaller in magnitude when compared to a different memory cell 305 having a relatively high threshold voltage.

For example, the memory cells 305 that include a higher threshold voltage and a lower synaptic weight can be altered toward threshold voltage associated with a set state. For example, memory cell 305-2 can have a higher threshold voltage and correspond to synaptic weight W2. When the memory cell 305-2 is pulsed during a training interval, the threshold voltage of the memory cell 305-2 can change toward a voltage associated with a set state and the synaptic weight W2 can become higher than before the training interval. Because the threshold voltage of the memory cell 305-2 is higher and can be associated with a reset voltage, the magnitude of the voltage drift further toward the reset state can be greater.

The neural memory unit controller can also bias an unselected access line 310-N (e.g., an access line not included in the neural memory unit 323) to a read voltage value. In some cases, the read voltage values applied to the one or more unselected access lines 310-N are the same as the voltage values applied to the selected access lines 310-1, 310-2, 310-3. In some cases, the read voltage values applied to the unselected access lines 310-N are different than a voltage value applied to one of the selected access lines 310-1, 310-2, 310-3.

The neural memory unit controller can detect an output 343 that includes one or more signals generated on one or more sense lines 315 coupled with the neural memory unit 323. The output 343 on the sense lines 315 can be generated based on applying the input 341 to the access lines 310 coupled with the neural memory unit 323. The signals of the output 343 can comprise current signals (e.g., I1, I2, I3).

An individual signal, an individual threshold voltage, and/or synaptic weight can be detected on each sense line 315 coupled with the neural memory unit 323. Each signal or weight can have different memory cells contributing to the signal. For example, the memory cells 305-1, 305-4, and 305-7 can contribute to the signal on the first sense line 315-1. The memory cells 305-2, 305-5, and 305-8, can contribute to the signal on the second sense line 315-2. The memory cells 305-3, 305-6, and 305-9 can contribute to the signal on the third sense line 315-S.

The neural memory unit controller can determine the output value stored in the neural memory unit 323 based on the detecting the signals generated on the sense lines 315 coupled with the neural memory unit 323. The neural memory unit controller can combine signals and/or the threshold voltage (e.g., synaptic weights) on each sense line 315 to generate a total weight (can be referred to as a total output value). The neural memory unit controller can sum the signals of the sense lines 315 to generate the total output value. In some cases, the neural memory unit controller can generate a product by applying a weight matrix to an input vector of voltages that represent the one or more voltages on one or more access lines (e.g. V1, V2, V3). For example, the neural memory unit controller can apply a vector by matrix multiplication operation, where the vector is the input 341 (V1, V2, and V3), and the matrix is the threshold voltage of the respective memory cells 305 included in the neural memory unit 323.

For example, the neural memory unit controller can be configured to apply a respective voltage pulse via each of the access lines 310 to change respective threshold voltages of respective memory cells 305 (e.g., a 3DXPoint cell or an SSM cell) coupled to each of the access lines 310 and to a particular sense line 315-1. In a training interval, the neural memory unit controller can apply a respective voltage to the memory cell 305-1, 305-4, and 305-7 to change a respective threshold voltage toward a voltage associated with a set state to effectuate synaptic weight changes (e.g., W1, W4, and W7). Each of the memory cells 305-1, 305-4, and 305-7 correspond to synaptic weights W1, W4, and W7 respectively and can receive the voltage pulse in this instance.

The neural memory unit controller can be further configured to, apply a subsequent respective voltage pulse via each of the access lines 310 to change a respective threshold voltage of a respective memory cell 305 coupled to each access lines 310 and to a different sense line 315-2 in the training interval toward a voltage associated with a set state to effectuate synaptic weight changes. In this instance, each of the memory cells 305-2, 305-5, and 305-8 corresponding to synaptic weights W2, W5, and W8 can receive the voltage. This example method can continue for any number of sense lines 315 to effectuate synaptic weight changes of the memory cells 305. Following a training interval, the neural memory unit controller can be configured to initiate a sleep interval for each of the access lines 310 to effectuate a voltage drift in the changed threshold voltage of the respective memory cells 305-1, 305-2, 305-4, 305-5, 305-7, and 305-8. The voltage drift can alter the changed respective threshold voltages toward a voltage associated with a reset state.

Figure 4:
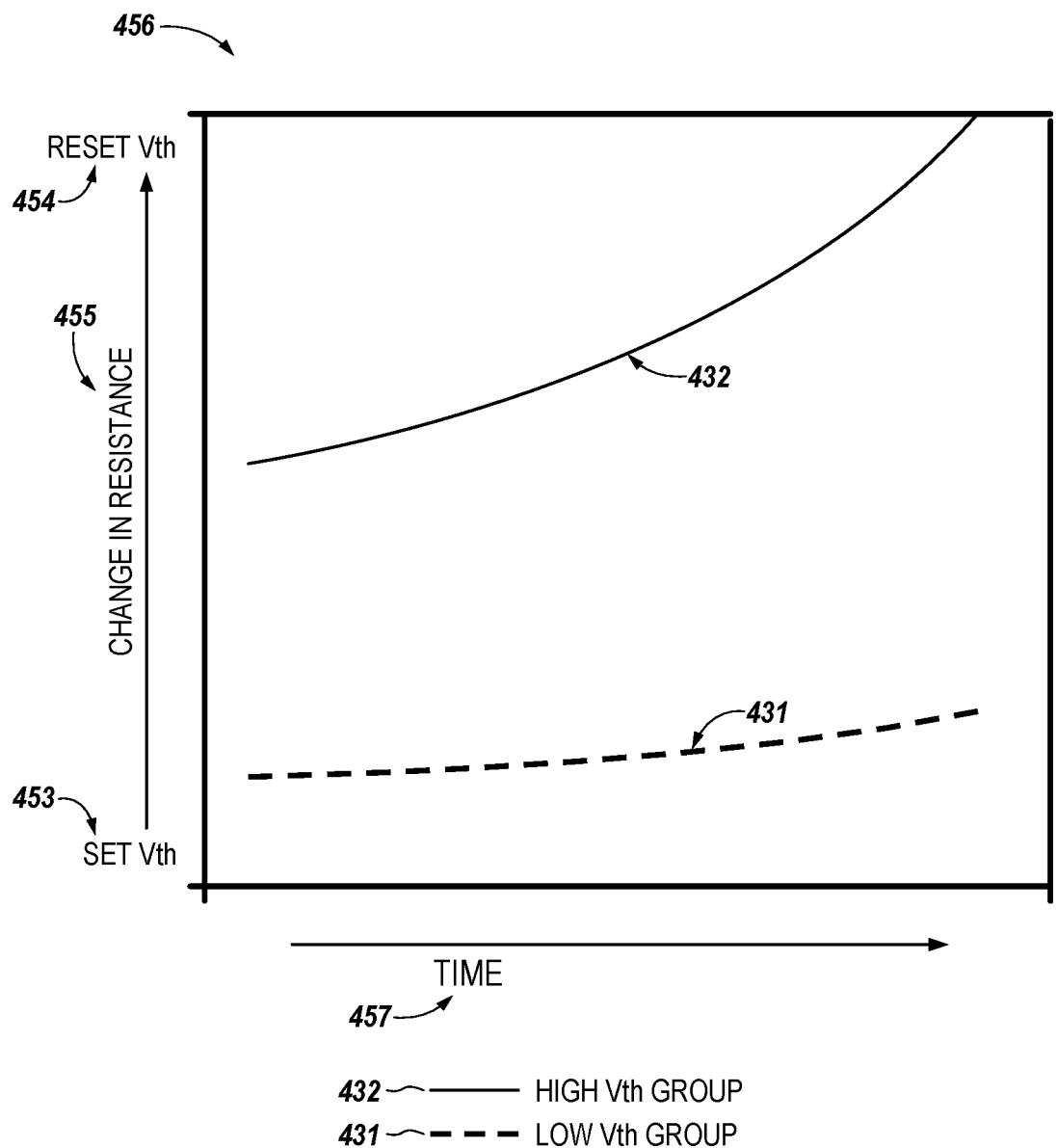
FIG. 4 illustrates an example graph of threshold voltage time plots of memory cells in accordance with an embodiment of the present disclosure.

FIG. 4 illustrates an example graph 456 of threshold voltage time plots of memory cells in accordance with an embodiment of the present disclosure. The graph 456 is an example of threshold voltage time plots of memory cells during a sleep interval, which is represented as time along the X-axis. During the sleep interval, memory cells (e.g., the memory cells 105, 205, and/or 305 of FIG. 1, 2, or 3) experience a voltage drift implicating a corresponding change in resistance 455, which is illustrated along the Y-axis. The graph 456 includes a voltage associated with a set state 453 at the bottom and a voltage associated with a reset state (e.g., reset Vth) 454 toward the top.

As illustrated by the legend, the line 432 represents a memory cell and/or a group of multiple memory cells with a relatively high threshold voltage (Vth) at the onset of a sleep interval. The broken line 431 represents a memory cell and/or a group of multiple memory cells with a relatively low threshold voltage (Vth) at the onset of the sleep interval.

While an individual sleep interval is represented here as an example, any number of sleep intervals could be used.

The relatively high and low threshold voltages can be the result of a neural memory unit controller (e.g., the memory controller 140 of FIG. 1) asserting a voltage pulse (or multiple voltage pulses) via an access line to change a threshold voltage of respective a memory cell during a training interval toward a voltage associated with a set state 453 to effectuate synaptic weight changes. Following the training interval, the neural memory unit controller can initiate a sleep interval to effectuate a voltage drift in the changed respective threshold voltage of the respective memory cells. The voltage drift alters the changed threshold voltage toward a voltage associated with a reset state 454.

The threshold voltage for the memory cell represented by the line 432 can be relatively high when the sleep interval begins and the threshold voltage for the memory cell represented by the broken line 431 can be relatively low when the sleep interval begins. The threshold voltage of the memory cells represented by the lines 432 and 431 are not limited to beginning or ending a sleep interval in a set or reset state. The memory cells represented by the lines 432 and 431 can begin and/or end a sleep interval at a threshold voltage associated with a set state, a threshold voltage associated with a reset state, or at a threshold voltage in between a set and reset state.

During a sleep interval, as time 457 increases, the voltage drift of the memory cell represented by the line 432 can increase to (or toward) a threshold voltage that is associated with the reset state 454. The voltage drift can increase a SNR of the memory cells of the array to distinguish between memory cells that are considered to be enhanced versus non-enhanced by allowing a portion of the respective memory cells with a higher changed respective threshold voltage to correspond to a larger voltage drift magnitude than a different portion of the memory cells with a lower changed respective threshold voltage (e.g., change in resistance 455) corresponding to a smaller voltage drift magnitude. In other words, the graph 456 illustrates the memory cells represented by the broken line 431 as having a relatively smaller voltage drift magnitude because the change in threshold voltage following a training interval is a threshold voltage associated with a set state.

Stated differently, because the memory cell 432 with a higher threshold voltage drift toward a reset state 454 faster than the memory cell 431 with a lower threshold voltage, the effect of the sleep interval on the distribution of threshold voltages in between set 453 and reset 454 for a memory cell array is a widening thereof. The result of this widening of the distribution of threshold voltages between set 453 and reset 454 at the end of time 457 allows a better determination of whether any particular memory cell is enhanced or non-enhanced.

A magnitude of voltage drift can correspond to an increase or a decrease in learning of a neural network in response to an increase or decrease in magnitude of voltage drift. For example, the larger voltage drift magnitude corresponding to the memory cell represented by the line 432 is indicative of a memory cell having a chalcogenide element (e.g., a 3DXPoint cell or an SSM cell) of the array that has remained unchanged (e.g., during the training interval) close to a voltage associated with the reset state 454. The smaller voltage drift magnitude is indicative of a memory cell having a chalcogenide element of the array that is trained toward a voltage associated with the set state 453. The larger voltage is associated to a less trained cell than the smaller voltage. Applying a sleep interval following a training interval can increase the SNR of the set and reset states of respective memory cells to distinguish between memory cells that are considered to be enhanced versus non-enhanced such that a distinction between memory cells that have learned and memory cells that have not learned can be identified. At the end of the time 457 (e.g., the end of the sleep interval), the difference in the Vth of the memory cell 432 and 431 is greater than at the beginning of the time 457 (e.g., the beginning of the sleep interval). The result of this difference in the Vth of the memory cell 432 and 431 between set 453 and reset 454 at the end of time 457 allows a better determination of whether any particular memory cell is enhanced or non-enhanced.

Figure 5:
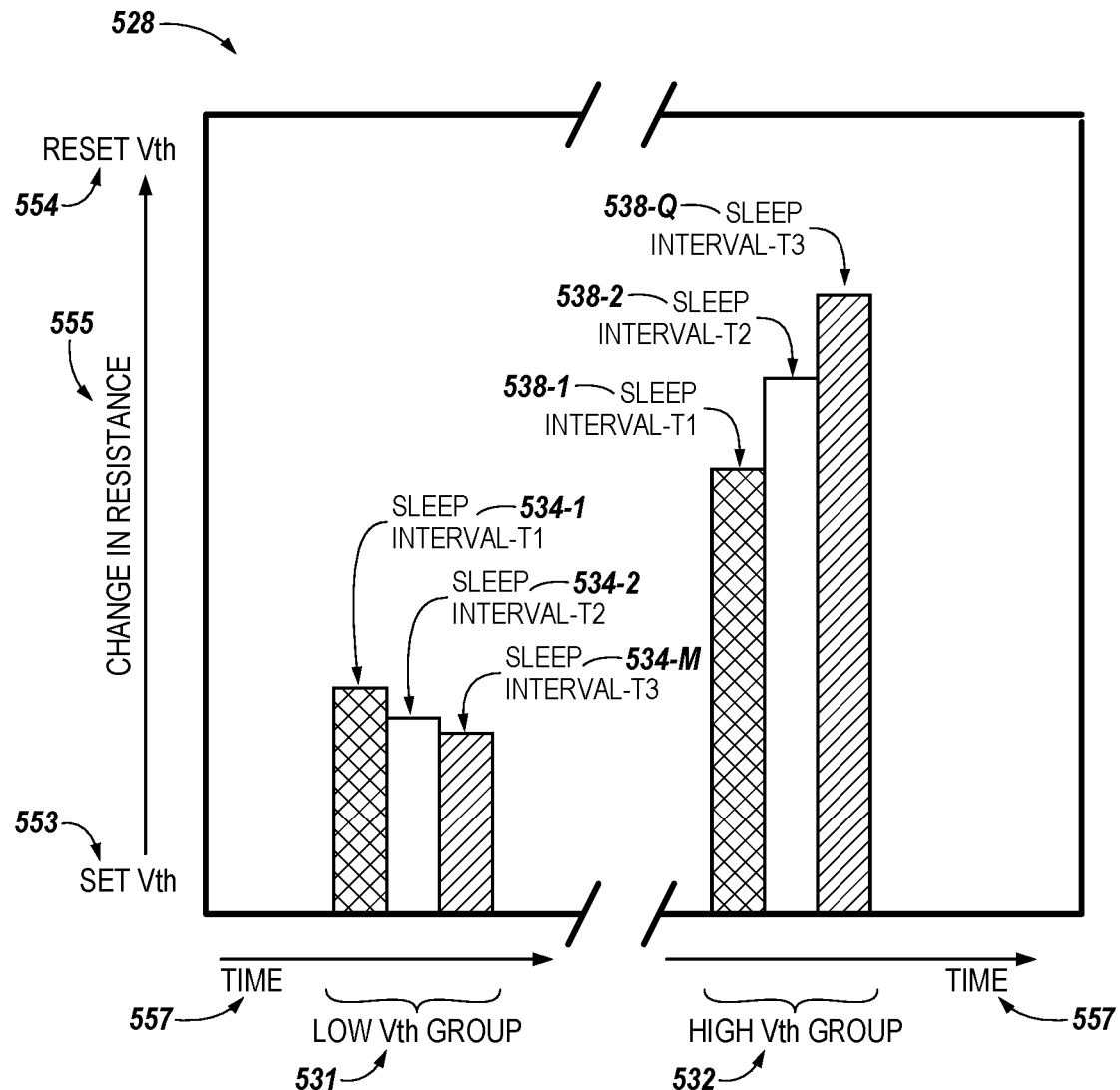
FIG. 5 illustrates example graph of threshold voltage distributions of memory cells in accordance with an embodiment of the present disclosure.

FIG. 5 illustrates an example graph 528 of threshold voltage distributions of memory cells in accordance with an embodiment of the present disclosure. The graph 528 is an example of multiple sleep intervals in which memory cells (e.g., the memory cells 105, 205, and/or 305 of FIG. 1, 2, or 3) experience a voltage drift. The low threshold voltage (Vth) group 531 can be similar to the group of memory cells 431 with a relatively low threshold voltage described in connection with FIG. 4. The high threshold voltage (Vth) group 532 can be similar to the group of memory cells 432 with a relatively high threshold voltage described in connection with FIG. 4. Illustrated as the Y-axis, the graph 528 includes a change in resistance 555 (e.g., a change in threshold voltage) of the respective memory cells, with a voltage associated with a set state (Set Vth) 553 at the bottom and a voltage associated with a reset state (Reset Vth) 554 toward the top.

The example graph 528 includes the X-axis representing time 557 of the sleep interval increasing from the left to the right. For clarity and ease of comparison, the sleep intervals 534-1, 534-2, and 534-M of the Low Vth Group 531, and the sleep intervals 538-1, 538-2, and 538-Q of the high Vth group 532 are illustrated in the same FIG. 5 as a broken graph. In other words, the high Vth group 532 and the low Vth group 531 are both referencing the Y-axis 555, where the time 557 for both the low Vth group 531 and the high Vth group 532 is the same incidence in time.

The low Vth group 531 and the high Vth group 532 can be memory cells that are a portion or an entire array (e.g., 101, 201, 301, of FIGS. 1, 2, and 3) comprising a neural memory unit (e.g., the neural memory unit 323 of FIG. 3). The sleep interval 534-1 and 538-1 are illustrating the effects of the same sleep interval at Time 1 (Ti) on a low Vth group 531 and a high Vth group 532 respectively. The sleep interval 534-2 and 538-2 are illustrating the effects of the same (e.g., subsequent) sleep interval at Time 2 (T2) on a low Vth group 531 and a high Vth group 532 respectively. The sleep interval 534-M and 538-Q are illustrating the effects of the same (e.g., subsequent) sleep interval at Time 3 (T3) on a low Vth group 531 and a high Vth group 532 respectively.

The sleep intervals 534-1, 534-2, and 534-M can be multiple sleep intervals of the low Vth group 531 of memory cells and can be collectively referred to as sleep intervals 534. The sleep intervals 534-1, 534-2, 534-M can each follow a training interval to effectuate a voltage drift. The sleep intervals 538-1, 538-2, and 538-Q can be the multiple sleep intervals applied the high Vth group 532 of memory cells and can be collectively referred to as sleep intervals 532. The sleep intervals 538-1, 538-2, 538-Q can each follow a training interval to effectuate a voltage drift.

A neural memory unit controller (e.g., the memory controller 140 of FIG. 1) can be coupled to signal lines (e.g., access lines 110 and sense lines 115 of FIG. 1) with a memory cell (e.g., the memory cell 105 of FIG. 1) connected at the intersection of each signal line. The neural memory unit controller can be configured to assert a respective voltage pulse during a training interval (e.g., V1, V2, V3 of input 341 of FIG. 3) via one or more access lines to change a respective threshold voltage of respective memory cells of the array coupled to each of the first signal lines at an intersection with one or more sense lines in a training interval toward a voltage associated with a set state to effectuate respective synaptic weight changes.

For example, the memory cells of the low Vth group 531 and the memory cells of the high Vth group 532 can be each coupled to sense lines and access lines of a neural memory unit array. During a training interval, voltage pulses can be applied to the memory cells to change the chalcogenide material configuration in each of the memory cells toward a condition associated with a set state. The high Vth group 532 can include a chalcogenide material in a material configuration closer to the reset state and a relatively high resistance (e.g., low current flow) and the change in threshold voltage toward a set state can be relatively small compared to the low Vth group 531.

For example, following the training interval, but before the sleep interval 538, the respective memory cells of the high Vth group 532 can experience a change of respective threshold voltage toward the set state. The low Vth group 531 can include a chalcogenide material in a material configuration closer to the set state and a relatively low resistance (e.g., high current flow) and the change in relative threshold voltage toward a set state can be relatively large compared to the high Vth group 532. Stated differently, following the training interval, but before the sleep interval 534, the memory cells of the low Vth group 534 can experience a threshold voltage change toward the set state.

In some embodiments, the neural memory unit controller can be configured to idle (e.g., low power and/or power off) to effectuate a sleep interval. The sleep interval can be applied in an alternating fashion to follow a training interval. Multiple sleep intervals can be applied to the respective memory cells without a training interval in between, and/or multiple training intervals can be applied without a sleep interval in-between. The quantity and/or the order of sleep intervals and training intervals can be a portion of a learning algorithm. The sleep intervals 534 and 538 are illustrated as non-limiting examples of sleep intervals following a training interval. For example, sleep interval 534-1 can follow a first training interval, the sleep intervals 534-2 and 534-M can follow subsequent training intervals.

The sleep interval can be initiated by the neural memory unit controller when the voltage pulse is removed (e.g., the memory cells of the array are no longer being accessed). For example, the neural memory unit controller can initiate sleep interval (e.g., first sleep interval 534-1 and 538-1) following the training interval for each of the respective memory cells coupled to the access lines for a to effectuate respective voltage drifts in the changed respective threshold voltages of the memory cells toward a voltage associated with the reset state 554.

The voltage drift of the sleep interval is lesser when the changed threshold voltage of the memory cell is closer to the voltage associated with the set state 553 than the voltage associated with the reset state 554. Voltage drift toward a reset state 554 during the sleep interval is greater when the changed threshold voltage of the memory cell is closer to the voltage associated with the reset state 554 than the voltage associated with the set state 553. In other words, after the first sleep interval 534-1 the memory cells of the low Vth group 531 changed toward the reset state 554 less than the first sleep interval 538-1 of the memory cells of the high Vth group 532. The neural memory unit controller can be configured to read a voltage from the sense lines to determine a total output value of the array after the sleep interval.

The neural memory unit controller can apply subsequent training intervals to the array of memory cells based on the total output value of the array. For example, the neural memory unit controller can assert subsequent respective voltage pulses in a subsequent training interval to one or more access lines to change the threshold voltage of the respective memory cells to effectuate a subsequent respective synaptic weight change (e.g., W1 of memory cell 305-1 of FIG. 3) based in part on the total output value of the array.

Following the subsequent training interval, the neural memory unit controller can initiate a subsequent sleep interval. The neural memory unit controller can determine an output value of the memory cells of the array of the memory cells after the first sleep interval 534-1, 538-1 effectuating the first respective voltage drift and determine a different respective voltage pulse for the subsequent training intervals based in part on the output value of the array after the first sleep interval 534-1, 538-1 effectuating respective the first voltage drift.

For example, the neural memory unit controller can be further configured to initiate a subsequent sleep intervals (e.g., sleep intervals 534-2 and 538-2) to effectuate the voltage drift after each subsequent training interval, where each effectuated voltage drift increases a SNR of the memory cells of the array to distinguish between memory cells that are considered to be enhanced versus non-enhanced. In other words, the trend of the change in resistance 555 following sleep intervals 534-1, 534-2, and 534-M for the low Vth group 531 is a trend that preserves the respective threshold voltage associated with a set state 553 (e.g., preserves the enhanced synapse effectuated by the training intervals). The trend of the change in resistance 555 following sleep intervals 538-1, 538-2, and 538-Q for the high Vth group 532 is a trend that does not preserve a non-enhanced threshold voltage associated with a reset state 554 following a training interval.

As each subsequent sleep interval is applied, the memory cells with a relatively high Vth 532 will drift toward a reset Vth 554 and the memory cells with a relatively low Vth 531 will remain closer to a voltage associated with a set Vth 553. Using these methods, the SNR of the set and reset states can be increased to distinguish between memory cells of the array that have experienced learning (e.g., the synapses are enhanced, the Low Vth group 531) and memory cells that did not experience learning (e.g., non-enhanced synapses, the high Vth group 531). In other words, the subsequent drift intervals can increase a SNR of the set and reset states of the respective memory cells of the array to distinguish the portions of the memory cells that have increased synaptic weights (e.g., enhanced) and decreased synaptic weights (non-enhanced), and the SNR of the memory cells that are considered to be enhanced versus non-enhanced can be increased by allowing a voltage drift (e.g., sleep intervals) following a training interval.

FIG. 6 illustrates an example method 677 for neural network memory using a memory device in accordance with embodiments of the present disclosure. The operations of method 677 can be implemented by a neural memory unit controller (e.g., the memory controller 140 of FIG. 1) or its components as described herein. For example, the operations of method 677 can be performed within a neural memory unit as described with reference to FIGS. 1-5. In some examples, a neural memory unit controller can execute a set of codes to control the functional elements of a memory device to perform the functions described below. Additionally, or alternatively, the neural memory unit controller can perform aspects of the functions described below using special-purpose hardware.

At block 692, method 677 includes asserting, by a neural memory unit controller coupled to an array (e.g., the array 101 of FIG. 1) of memory cells (e.g., the memory cells 105 of FIG. 1), respective voltage pulses during a first training interval to memory cells of the array to effectuate a change in respective threshold voltages of the memory cell toward a voltage associated with a set state.

At block 694, the method 677 includes initiating, by the neural memory unit controller, a first sleep interval, during which no pulses are applied to the memory cells, to effectuate a first respective voltage drift in the changed respective threshold voltage of the memory cells, where a voltage drift is a change in the respective threshold voltage of the respective memory cells toward a voltage associated with a reset state.

In some embodiments, the method 677 can include asserting, by the neural memory unit controller, a different respective voltage pulse to the memory cells of the array during a subsequent training interval to effectuate subsequent change in respective threshold voltages of the memory cells further toward the voltage associated with the set state. In this way, memory cells with a low threshold voltage following an initial training interval can preserve the voltage associated with a set state.

The method 677 can further include initiating, by the neural memory unit controller, a subsequent sleep interval to effectuate a respective subsequent voltage drift in the changed respective threshold voltage of the memory cells, wherein the magnitude of the subsequent respective voltage drift is less than the magnitude of the first respective voltage drift. For example, each respective memory cell of the memory cells can include a chalcogenide material in an increasingly high threshold voltage condition during the subsequent respective voltage drift responsive to the memory cells having a relatively high threshold voltage. Additionally, a chalcogenide material of the memory cell can be in an increasingly stable low threshold condition during the subsequent voltage drift responsive to the memory cell having a relatively low threshold voltage. This can increase the SNR of the memory cells to distinguish between memory cells that are considered to be enhanced versus non-enhanced. In this way a neural memory unit can be configured to mimic neurobiological function such as sleep and learning.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

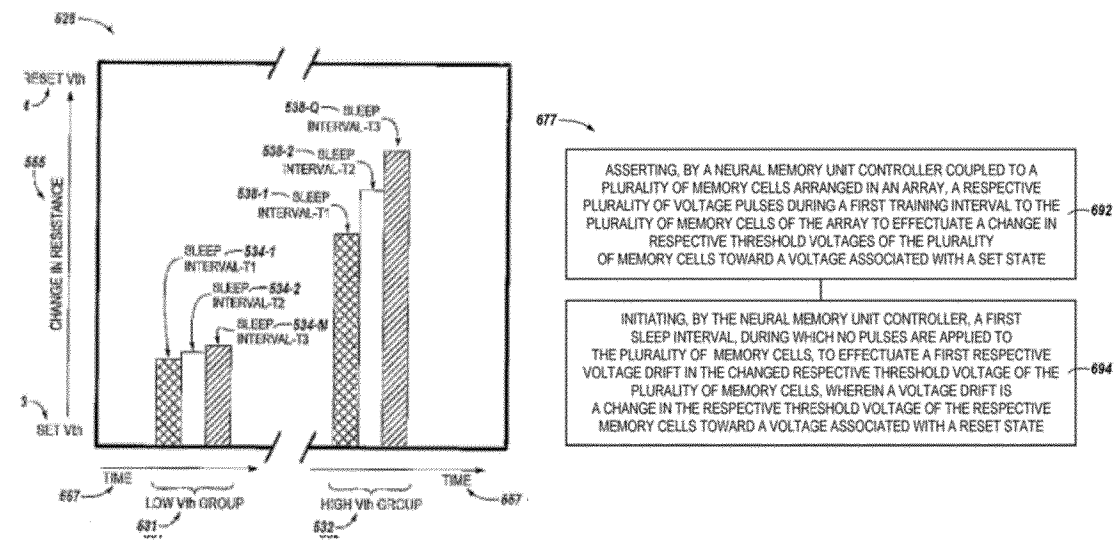

What is claimed is:

1. An apparatus, comprising:
an array of memory cells; and
a neural memory unit controller coupled to the array of memory cells and configured to:
assert a respective plurality of voltage pulses during a first training interval to a plurality of memory cells of the array to change respective threshold voltages of the plurality of memory cells from voltages associated with a reset state to effectuate respective synaptic weight changes;
initiate a sleep interval, during which no pulses are applied to the plurality of memory cells, to effectuate respective voltage drifts in the changed respective threshold voltages of the plurality of memory cells from a voltage associated with a set state toward the voltage associated with the reset state; and
determine an output of the plurality of memory cells responsive to the respective voltage drifts in the changed respective threshold voltages after the sleep interval.

2. The apparatus of claim 1, wherein the neural memory unit controller is configured to initiate the sleep interval to effectuate a first synaptic weight change in a first memory cell and a second synaptic weight change in a second memory cell; and
wherein the first memory cell has a threshold voltage closer to a voltage associated with a reset state than a set state and the second memory cell has a threshold voltage closer to a voltage associated to the set state than the reset state; and wherein the first synaptic weight change is less than the second synaptic weight change.

3. The apparatus of claim 1, wherein the plurality of memory cells are self-selecting memory (SSM) cells that include a chalcogenide material to operate as a selection component and a storage component.

4. The apparatus of claim 1, wherein the plurality of memory cells respectively comprise a chalcogenide material selection component and a phase change storage component.

5. The apparatus of claim 4, wherein the neural memory unit controller being configured to assert the respective plurality of voltage pulses in the first training interval comprises the neural memory unit controller being configured to assert the respective plurality of voltage pulses to the plurality of memory cells to change the respective phase change storage component from a material configuration associated with the reset state to a material configuration associated with a transition state from reset to set.

6. The apparatus of claim 4, wherein the neural memory unit controller being configured to assert the respective plurality of voltage pulses in the first training interval comprises the neural memory unit controller being configured to assert the respective plurality of voltage pulses to the plurality of memory cells to change the respective phase change storage component from a material configuration associated with the reset state toward a material configuration associated with the set state after the training interval.

7. The apparatus of claim 1, wherein the neural memory unit controller is further configured to operate the plurality of memory cells of the array as a neural network, wherein the changed respective threshold voltages of the plurality of memory cells represent a synaptic weight; and wherein additional respective plurality of voltage pulses during subsequent training intervals each decrease a resistance of the plurality of memory cells to represent an increased synaptic weight.

8. The apparatus of claim 7, wherein the neural memory unit controller is configured to assert one of the additional respective plurality of voltage pulses during one of the subsequent training intervals to the plurality of memory cells of the array in response to the output of the memory cell indicating that increased learning has occurred responsive to the effectuated voltage drift.

9. The apparatus of claim 7, wherein a magnitude of voltage drift corresponds to an increase or a decrease in learning of the neural network in response to an increase or decrease in magnitude of voltage drift.

10. The apparatus of claim 1, wherein the neural memory unit controller is further configured to operate the plurality of memory cells of the array as a neural network, wherein the changed respective threshold voltages of the plurality of memory cells represent a synaptic weight; and wherein additional respective plurality of voltage pulses during subsequent training intervals refrain from changing a resistance and the synaptic weight of the plurality of memory cells.

11. An apparatus, comprising:
a plurality of first signal lines;
a plurality of second signal lines;
an array of memory cells; and
a neural memory unit controller coupled to the plurality of first signal lines and the plurality of second signal lines, the neural memory unit controller configured to:
assert a respective plurality of voltage pulses during a training interval via each of the plurality of first signal lines to change respective threshold voltages of a plurality of respective memory cells of the array coupled to each of the plurality of first signal lines at an intersection with each of the plurality of second signal lines toward a voltage associated with a set state to effectuate respective synaptic weight changes;
initiate a sleep interval following the training interval for each of the plurality of respective memory cells coupled to the first signal lines to effectuate respective voltage drifts in the changed respective threshold voltages of the plurality of respective memory cells, wherein the voltage drift alters the changed respective threshold voltage toward a voltage associated with a reset state; and
read a voltage to determine a total output value of the array after the sleep interval.

12. The apparatus of claim 11, wherein the neural memory unit controller is further configured to assert subsequent respective voltage pulses in a subsequent training interval via each of the plurality of first signal lines to change the threshold voltage of the respective plurality of memory cells to effectuate a subsequent respective synaptic weight change based in part on the total output value of the array.

13. The apparatus of claim 12, wherein the neural memory unit controller is further configured to initiate a subsequent sleep interval and effectuate the voltage drift after each subsequent training interval, wherein each effectuated voltage drift increases a signal to noise ratio of the plurality of memory cells of the array considered to be enhanced versus non-enhanced.

14. The apparatus of claim 11, wherein the sleep interval increases a signal to noise ratio of the plurality of memory cells of the array considered to be enhanced versus non-enhanced, by allowing a portion of the plurality of memory cells with a higher changed respective threshold voltage to correspond to a larger voltage drift magnitude than a different portion of the plurality of memory cells with a lower changed respective threshold voltage corresponding to a smaller voltage drift magnitude.

15. The apparatus of claim 14, wherein the smaller voltage drift magnitude is indicative of a memory cell of the plurality of memory cells of the array that is trained toward a voltage associated with the set state.

16. The apparatus of claim 14, wherein the larger voltage drift magnitude is indicative of a memory cell of the plurality of memory cells of the array that is not trained or remains close to a voltage associated with the reset state.

17. A method, comprising:
asserting, by a neural memory unit controller coupled to a plurality of memory cells arranged in an array, a respective plurality of voltage pulses during a first training interval to the plurality of memory cells of the array to effectuate a change in respective threshold voltages of the plurality of memory cells toward a voltage associated with a set state; and
initiating, by the neural memory unit controller, a first sleep interval, during which no pulses are applied to the plurality of memory cells, to effectuate a first respective voltage drift in the changed respective threshold voltage of the plurality of memory cells, wherein a voltage drift is a change in the respective threshold voltage of the respective memory cells toward a voltage associated with a reset state.

18. The method of claim 17, further comprising:
asserting, by the neural memory unit controller, a different respective voltage pulse to the plurality of memory cells of the array during a subsequent training interval to effectuate subsequent change in respective threshold voltages of the plurality of memory cells further toward the voltage associated with the set state; and
initiating, by the neural memory unit controller, a subsequent sleep interval to effectuate a respective subsequent voltage drift in the changed respective threshold voltage of the plurality of memory cells, wherein the magnitude of the subsequent respective voltage drift is less than the magnitude of the first respective voltage drift.

19. The method of claim 18, further comprising:
determining an output value of the plurality of memory cells of the array after the first sleep interval effectuating the first respective voltage drift; and
determining the different respective voltage pulse for the subsequent training interval based in part on the output value of the array after the first sleep interval effectuating the first respective voltage drift.

20. The method of claim 18, wherein the subsequent sleep intervals increase a signal to noise ratio of the set and reset states of the respective plurality of memory cells of the array to distinguish portions of the plurality of memory cells that are considered to be enhanced versus non-enhanced.

21. The method of claim 18, wherein each respective memory cell of the plurality of memory cells include a chalcogenide material in an increasingly high threshold voltage of the material configuration during the subsequent respective voltage drift responsive to the plurality of memory cells having a relatively high threshold voltage.

* * * * *

UNITED STATES PATENT AND TRADEMARK OFFICE
CERTIFICATE OF CORRECTION

PATENT NO. : 10,861,539 B1
APPLICATION NO. : 16/546520
DATED : December 8, 2020
INVENTOR(S) : Mattia Boniardi et al.

It is certified that error appears in the above-identified patent and that said Letters Patent is hereby corrected as shown below:

On the Title Page

Please replace the Title Page with the attached Title Page.

Signed and Sealed this
Tenth Day of May, 2022

Katherine Kelly Vidal
*Director of the United States Patent and Trademark Office*

CERTIFICATE OF CORRECTION (continued)

(12) United States Patent
Boniardi et al.

(10) Patent No.: US 10,861,539 B1
(45) Date of Patent: Dec. 8, 2020

(54) NEURAL NETWORK MEMORY

(71) Applicant: Micron Technology, Inc., Boise, ID (US)

(72) Inventors: Mattia Boniardi, Cormano (IT); Innocenzo Tortorelli, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/546,520

(22) Filed: Aug. 21, 2019

(51) Int. Cl.
| | |
|---|---|
| *G11C 11/54* | (2006.01) |
| *G06N 3/08* | (2006.01) |
| *G06N 3/063* | (2006.01) |
| *G11C 13/00* | (2006.01) |
| *H01L 45/00* | (2006.01) |

(52) U.S. Cl.
CPC ......... *G11C 13/0004* (2013.01); *G06N 3/063* (2013.01); *G06N 3/08* (2013.01); *G11C 11/54* (2013.01); *G11C 13/003* (2013.01); *G11C 13/004* (2013.01); *G11C 13/0061* (2013.01); *G11C 13/0023* (2013.01); *H01L 45/141* (2013.01)

(58) Field of Classification Search
CPC ............ G11C 13/0004; G11C 13/0061; G11C 13/003; G11C 13/004; G11C 13/0023; G11C 11/54; G06N 3/08; H01L 45/141
See application file for complete search history.

(56) References Cited

U.S. PATENT DOCUMENTS

| | | | |
|---|---|---|---|
| 2010/0223220 A1* | 9/2010 | Modha | G06N 3/0635 706/33 |
| 2017/0177994 A1* | 6/2017 | Salinga | G06N 3/0635 |
| 2019/0164600 A1 | 5/2019 | Castro | |
| 2019/0198105 A1 | 6/2019 | Pirovano | |

OTHER PUBLICATIONS

Ambrogio, et al., "Unsupervised Learning by Spike Timing Dependent Plasticity in Phase Change Memory (PCM) Synapses", vol. 10, Article 56, Mar. 8, 2016, 12 pages.
(Continued)

*Primary Examiner* — Sultana Begum
(74) *Attorney, Agent, or Firm* — Brooks, Cameron & Huebsch, PLLC

(57) ABSTRACT

In an example, an apparatus can include an array of memory cells and a neural memory unit controller coupled to the array of memory cells and configured to assert respective voltage pulses during a first training interval to memory cells of the array to change respective threshold voltages of the memory cells from voltages associated with a reset state to effectuate respective synaptic weight changes. The neural memory unit controller can be configured to initiate a sleep interval, during which no pulses are applied to the memory cells, to effectuate respective voltage drifts in the changed respective threshold voltages of the memory cells from a voltage associated with a set state toward the voltage associated with the reset state, and determine an output of the memory cells responsive to the respective voltage drifts in the changed respective threshold voltages after the sleep interval.

21 Claims, 6 Drawing Sheets